United States Patent [19]
Hoffmann et al.

[11] Patent Number: 5,184,326
[45] Date of Patent: Feb. 2, 1993

[54] INTEGRATED SEMICONDUCTOR MEMORY OF THE DRAM TYPE AND METHOD FOR TESTING THE SAME

[75] Inventors: Kurt Hoffmann, Taufkirchen; Rainer Kraus, München; Oskar Kowarik, Grafing, all of Fed. Rep. of Germany

[73] Assignee: Siemens Aktiengesellschaft, Munich, Fed. Rep. of Germany

[21] Appl. No.: 494,122

[22] Filed: Mar. 15, 1990

[30] Foreign Application Priority Data

Mar. 16, 1989 [EP] European Pat. Off. ........ 89104715.1

[51] Int. Cl.$^5$ .............................................. G11C 7/00
[52] U.S. Cl. .................................... 365/201; 365/203; 365/149
[58] Field of Search ............... 365/149, 201, 210, 203, 365/190, 204

[56] References Cited

U.S. PATENT DOCUMENTS 4,799,196  1/1989  Takemae ........................ 365/210 X

FOREIGN PATENT DOCUMENTS 2462220  6/1976  Fed. Rep. of Germany .
2184311  6/1987  United Kingdom .

OTHER PUBLICATIONS

Journal of Solid-State Circuits, vol. SC-20, No. 5, Oct. 1985, Shozo Saito et al: A 1-Mbit "CMOS DRAM with Fast Page Mode and Static Column Mode", pp. 903–908.
IEEE Journal of Solid-State Circuits, vol. SC-22, No. 5, Oct. 1987, Katsutaka Kimura et al: "A 65-ns 4-Mbit CMOS DRAM with a Twisted Driveline Sense Amplifier", pp. 651–656.
1984 IEEE International Solid-State Circuits Conference, ISSCC 84/Friday, Feb. 24, 1984, Session XVIII: 256K/1Mb DRAMs-II; Roger I. Kung et al: "FAM 18.4: A Sub 100ns 256K DRAM in CMOS III Technology"; pp. 278, 279, 354.
IBM Technical Disclosure Bulletin, vol. 20, No. 11A, Apr. 1978, R. H. Linton "Technique For Optimizing Signals in Dynamic Memory Systems", pp. 4297, 4298.
IBM Technical Disclosure Bulletin, vol. 20, No. 11A, Apr. 1978 R. H. Linton "Memory Noise Compensation Network", pp. 4299, 4300.

Primary Examiner—Joseph A. Popek
Attorney, Agent, or Firm—Herbert L. Lerner; Laurence A. Greenberg

[57] ABSTRACT

An integrated semiconductor memory of the DRAM type includes word lines and bit line pairs. Memory cells in a matrix are connected to the word lines and the bit lines. One evaluator circuit per bit line pair is connected to the bit lines. Each of the bit line pairs is divided into one bit line and one reference bit line during operation. A control line is provided. At least one coupling capacitor is provided for each of the bit lines and each of the reference bit lines having a first lead connected to the bit line pair and a second lead connected to the control line. A method for testing an integrated semiconductor memory of the DRAM type includes reading data stored in memory cells out of the memory cells, precharging bit line pairs to a precharge level before reading out, and feeding an additional potential to each bit line pair after precharging.

28 Claims, 7 Drawing Sheets

INTEGRATED SEMICONDUCTOR MEMORY OF THE DRAM TYPE AND METHOD FOR TESTING THE SAME

BACKGROUND AND PRIOR ART

The invention relates to an integrated semiconductor memory of the DRAM type, including word lines, bit line pairs, memory cells disposed in matrix form, and one evaluator circuit per bit line pair, each of the bit line pairs being divided into one bit line and one reference bit line during operation. The invention also relates to a method for testing an integrated semiconductor memory of the DRAM type, in which data stored in memory cells are read out of the memory cells and in which bit line pairs are precharged before the readout to a precharge level.

Integrated semiconductor memories of the generic type described above are known, for example, from the following publications:

IEEE Journal of Solid-State Circuits, Vol. SC-20, No. 5, Oct. 1985, pp. 903-908, "A 1-Mbit CMOS DRAM with Fast Page Mode and Static Column Mode". The publication discloses a generic integrated semiconductor memory with so-called "complementary capacitor coupled dummy cells". Possible dummy cells in this case include traditional dummy cells, in other words those constructed as one-transistor memory cells;

IEEE Journal of Solid-State Circuits, Vol. SC-22, No. 5, Oct. 1987, pp. 651-656, "A 65-ns 4-Mbit CMOS DRAM with a Twisted Driveline Sense Amplifier"; and 1984 IEEE International Solid-State Circuits Conference, ISSCC 84, Feb. 24, 1988, pages 278, 279 and 354, entitled "A Sub 100ns 256K DRAM in CMOS III Technology". Both publications show generic integrated semiconductor memories with dummy cells.

When testing integrated semiconductor memories of the DRAM type, it would often be desirable to be able to detect not only the properties that are usually detectable, such as current consumption, functional capacity, and sensitivity to certain test patterns, but also properties that determine the operating range of various circuit parts of a semiconductor memory (such as cell capacitance, symmetry of memory cells at bit lines and reference bit lines, and symmetry of evaluator circuits). Heretofore, this could only be done, for instance, by applying supply potentials having values outside the range defined by the specification, for components mounted in their final form. The same is true for the level of input signals. On the wafer level, it has so far additionally been possible to supply auxiliary signals and/or auxiliary potentials for analysis and test purposes, for instance with the aid of so-called supplementary pads that are accessible only before a semiconductor memory is provided with a housing.

A further option for analysis on the wafer level is purposeful irradiation of the semiconductor memory with alpha particles. However, all of these options exert a rather global influence on the semiconductor memory. In other words, regions outside the memory cell field are usually undesirably affected as well.

SUMMARY OF THE INVENTION

It is accordingly an object of the invention to provide an integrated semiconductor memory of the dram type and a method for testing the same, which overcome the hereinafore-mentioned disadvantages of the heretofore-known methods and devices of this general type and which include devices that enable purposeful testing and analysis of a cell field without impairing normal operation, for a reasonable additional expense in terms of development and production. The testing and analysis should also be possible even with a semiconductor memory that is mounted in its final form.

With the foregoing and other objects in view there is provided, in accordance with the invention, an integrated semiconductor memory of the DRAM type, comprising word lines, bit line pairs, memory cells in a matrix being connected to the word lines and the bit lines, one evaluator circuit per bit line pair being connected to the bit lines, each of the bit line pairs being divided into one bit line and one reference bit line during operation, a control line, and at least one coupling capacitor for each of the bit lines and each of the reference bit lines having a first lead connected to the bit line pair and a second lead connected to the control line.

In accordance with another feature of the invention, the control line has a fixed potential during normal operation.

In accordance with a further feature of the invention, the control line has an electrically floating state during normal operation.

In accordance with an added feature of the invention, the control line carries a test signal with a preselectable high level in test operation.

In accordance with an additional feature of the invention, the control line carries a test signal with a preselectable low level in test operation.

In accordance with yet another feature of the invention, there is provided at least one other control line, at least one of the control lines having a fixed potential during test operation.

In accordance with yet a further feature of the invention, there is provided at least one other control line, at least one of the control lines having an electrically floating state during test operation.

In accordance with yet an added feature of the invention, the at least one coupling capacitor for each of the bit lines and each of the reference bit lines includes more than one coupling capacitor for each of the bit lines and each of the reference bit lines, and there are provided other control lines, each of the coupling capacitors being connected to one of the control lines, and the control lines carrying test signals in test operation being activatable independently of one another.

In accordance with yet an additional feature of the invention, there are provided dummy cells being used as coupling capacitors in test operation, triggering taking place with at least one test signal instead with dummy word lines, so that functioning as dummy cells is lost.

With the objects of the invention in view, there is also provided a method for testing an integrated semiconductor memory of the DRAM type, which comprises reading data stored in memory cells out of the memory cells, precharging bit line pairs to a precharge level before reading out, and feeding an additional potential to each bit line pair after precharging.

In accordance with another mode of the invention, there is provided a method which comprises feeding the additional potential through coupling capacitors.

In accordance with a further mode of the invention, there is provided a method which comprises controlling the feeding with at least one test signal.

In accordance with an added mode of the invention, there is provided a method which comprises controlling the feeding with an edge of at least one test signal.

In accordance with an additional mode of the invention, there is provided a method which comprises controlling the feeding with a positive edge of at least one test signal.

In accordance with a concomitant mode of the invention, there is provided a method which comprises controlling the feeding with a negative edge of at least one test signal.

Other features which are considered as characteristic for the invention are set forth in the appended claims.

Although the invention is illustrated and described herein as embodied in an integrated semiconductor memory of the dram type and a method for testing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
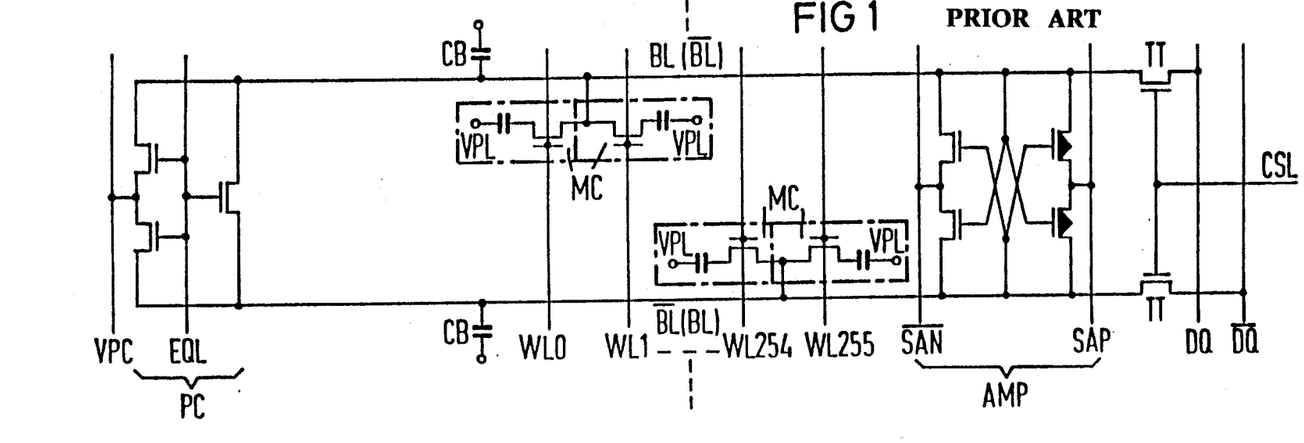
FIG. 1 is a schematic circuit diagram of a portion of a semiconductor memory in accordance with the prior art.

Referring now to the figures of the drawing in detail and first, particularly, to FIG. 1 thereof, it is seen that integrated semiconductor memories in accordance with the prior art include memory cells that are disposed in matrix form and are addressable through word lines and bit lines (as part of bit line pairs). FIG. 1 shows a portion of a bit line pair BL, $\overline{BL}$ having bit line capacitors CB which are present in parasitic form, memory cells MC and word lines WL which are associated therewith and are numbered consecutively from 0 (WL0) to 255 (WL255), for example, in order to distinguish them from one another. The bit line pair also has a precharge device PC. As is well known, during operation, before information is read from a memory cell MC, the bit line pair BL, $\overline{BL}$ is precharged to a precharge potential VPC. To this end, an equalization signal EQL is applied to the precharge device PC, causing a precharge potential VPC to reach the bit line pair BL, BL and to charge it to the precharge potential VPC. The memory cells MC in the known semiconductor memories of the DRAM type are typically constructed as so-called one-transistor memory cells, which contain at least one memory capacitor and one selection transistor. One lead of each memory capacitor is connected to a so-called plate potential VPL. In order to readout information from a memory cell MC, after precharging the selection transistor of the memory cell is electrically conductively connected through a word line WL connected thereto (that is, the memory cell MC is addressed). As a result, the charge stored as memorized information in the memory capacitor reaches the bit line BL of the bit line pair BL, $\overline{BL}$, associated with the memory cell MC. One bit line pair is formed of two lines, called the bit line BL and the reference bit line $\overline{BL}$. Whichever line is connected to the addressed memory cell MC is called the bit line. Correspondingly, whichever line is connected to other memory cells MC of the same bit line pair rather than to the addressed memory cell MC is called the reference bit line $\overline{BL}$. For instance, if one of the memory cells MC that are connected to one of the word lines WL0, WL1 is to be read out, then the line shown at the top in FIG. 1 will be called the bit line BL, while the line shown in the bottom in FIG. 1 will be called the reference bit line $\overline{BL}$. On the other hand, if one of the memory cells MC that is associated with one of the word lines WL254, WL255 is to be read out, then the bottom line in FIG. 1 will be called the bit line BL (as indicated in parentheses in FIG. 1), and the top line in FIG. 1 will be called the reference bit line $\overline{BL}$ (also noted in parentheses in FIG. 1). For easier comprehension, it will be assumed below that a readout of the memory cell MC connected to the word line WL0 is to be made. Since this description has general applicability, the reference symbol WL will be generally used below, instead of WL0.

The information present on the bit line BL after the readout, which will hereinafter be called the "read signal", is then evaluated by an evaluator circuit AMP and amplified. As a result, the read signal assumes the logical level assigned to it ("0" or "1"). Correspondingly, a signal which is complementary thereto forms on the reference bit line $\overline{BL}$, having a corresponding complementary logical level ("1" or "0"). Modern evaluator circuits AMP are typically constructed of two parallel-connected dynamic flip-flops, each being formed of cross-coupled transistors. One flip-flop generally contains transistors of the n-channel type and the other transistors of the p-channel type. In this case the flip-flops are controlled by two clock signals SAP and $\overline{SAN}$. This permits a rapid response of the evaluator circuit AMP and an ensuing rewriting of the read-out, amplified information into the read-out memory cell MC with full-value logical levels. The evaluated and amplified information reaches data output lines DQ, $\overline{DQ}$ through transfer transistors TT controlled by a non-illustrated decoder.

Figure 2:
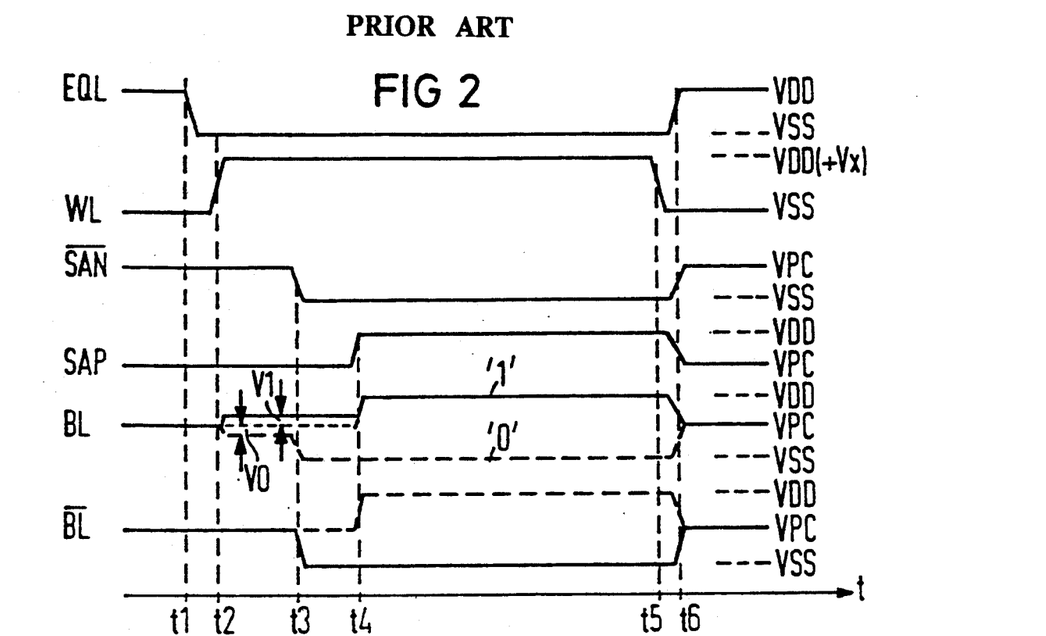
FIG. 2 is a pulse diagram for the configuration of FIG. 1.

The course of the entire process is shown in FIG. 2 in the form of a pulse diagram. Before the above-described reading and evaluation process begins, the equalization signal EQL is activated to perform the precharging operation, while all of the other signals are inactive. As a result, the bit line BL and the reference bit line $\overline{BL}$ assume the precharge potential VPC. At a time t1, which is subsequent to a takeover and decoding of addresses to be applied to the semiconductor memory, the equalization signal EQL is made inactive and the precharging operation is over. At a time t2, the word line WL is activated. As a result, the information stored in the addressed memory cell MC is read out onto the bit line BL. If the read-out information is equivalent to a logical 1, then as a result of the readout the (precharge) potential VPC present on the bit line BL is increased by an amount V1 corresponding to the read signal. However, if the read-out information corresponds to a logical 0, then the (precharge) potential VPC present on the bit line BL is reduced by an amount V0 corresponding to the read signal by means of the readout. This phase is shown in FIG. 2 as follows. The value of the precharge potential VPC is shown in dotted lines from time t2 on. The potential value of the bit line BL which is increased by the amount V1 is shown as a solid line from time t2 on. The potential value of the bit line BL lowered by the amount V0 is shown in dashed lines from the time t2 on.

At a time t3, one clock signal $\overline{SAN}$ is activated. Up to that time, the reference bit line $\overline{BL}$ still has its precharge potential VPC. If the bit line BL at the time t3 is at the potential which is increased by the amount V1, then the reference bit line $\overline{BL}$ assumes the value of logical 0 (represented by a solid line), while in contrast the bit line BL remains unchanged. However, if at the time t3 the bit line BL is at the potential which is decreased by the amount V0, then the bit line BL assumes the value of logical 0, while the reference bit line $\overline{BL}$ continues to maintain its precharge potential VPC with no change (shown in dashed lines). This is a first phase of the evaluation and amplification process.

At a time t4, a second phase ensues. At the time t4, the other clock signal SAP is activated. If at this time the bit line BL is at a potential which is increased by the amount V1, then the bit line BL assumes the value of logical 1, while the reference bit line $\overline{BL}$ remains unchanged at logical 0. However, if the bit line BL is already at logical 0, then the reference bit line $\overline{BL}$ assumes the value of logical 1.

At a later time t5, the word line WL is deactivated again. Next (at time t6), the clock signals $\overline{SAN}$ and SAP are deactivated and the equalization signal EQL is activated. The bit line BL and the reference bit line $\overline{BL}$ consequently resume the precharge potential VPC. For the sake of simplicity, in FIG. 2 (as in the other pulse diagrams to be described later), the value "logical 1" has been considered equivalent in terms of potential to a first supply potential VDD, and the value "logical 0" to a second supply potential VSS of the semiconductor memory. However, this is merely an example, and other potential values are possible. In the inactive state, the clock signals $\overline{SAN}$, SAP have the precharge potential VPC, while in the active state they have the values of logical 0 and logical 1, respectively.

Figure 3:
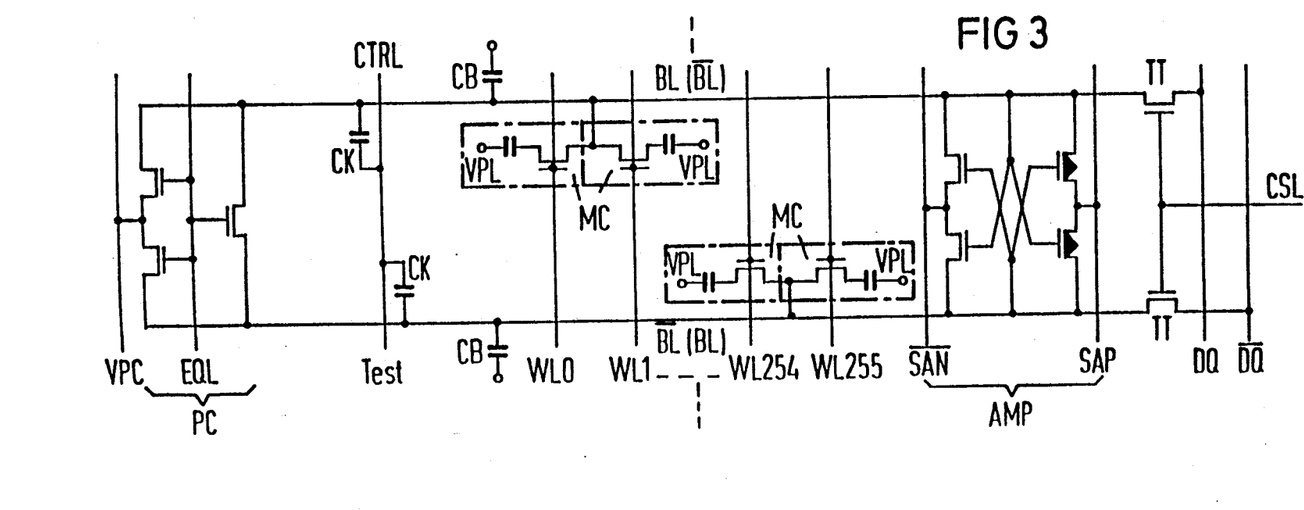
FIGS. 3 and 8–10 are circuit diagrams of configurations according to the invention.

As shown in FIG. 3, the integrated semiconductor memory according to the invention has one coupling capacitor CK per bit line BL and reference bit line $\overline{BL}$. The first lead of each coupling capacitor CK is connected to the bit line BL or the reference bit line $\overline{BL}$, respectively. The second leads of the coupling capacitors CK are connected in common to a control line CTRL. Thus during operation (in particular, test operation of the semiconductor memory is intended), an additional potential $\Delta$VPC can be fed to the bit line pair BL, $\overline{BL}$, which leads to different variations of the potentials on the bit line BL and on the reference bit line $\overline{BL}$ due to the aforementioned additional potential $\Delta$VPC, depending on the embodiment of a test signal Test, through which the control line CTRL can be acted upon. The operation and purpose of this configuration will be described below, in conjunction with pulse diagrams (FIGS. 4–7).

Figure 4:
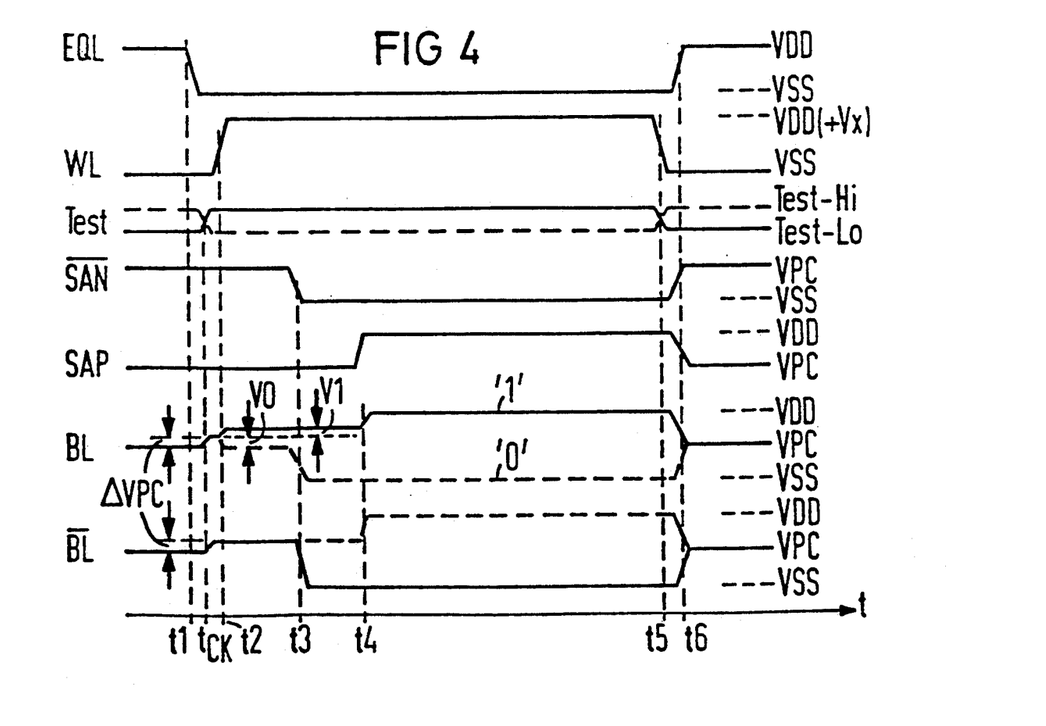
FIG. 4 is a pulse diagram for the configuration of FIG. 3.
Figure 5:
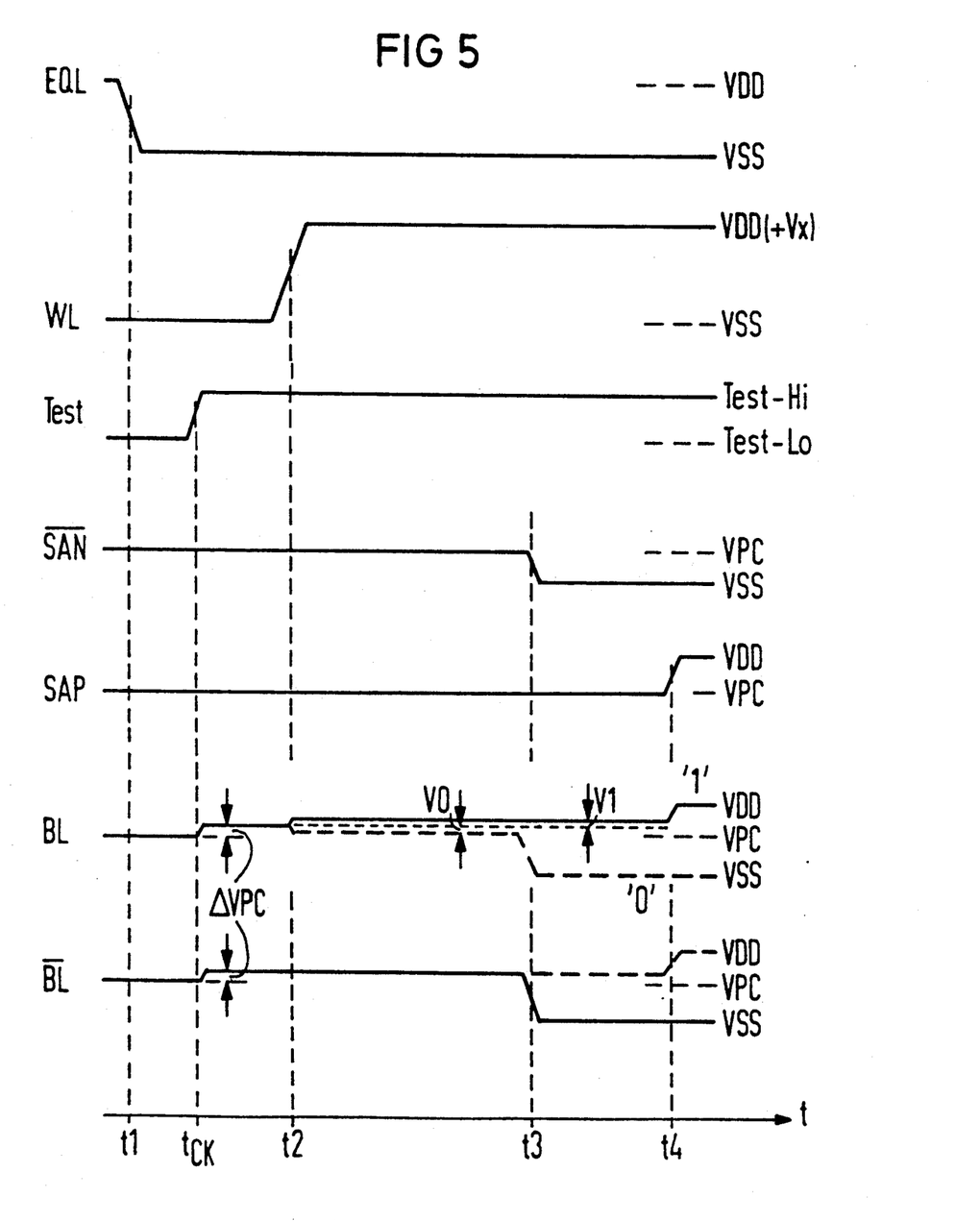
FIGS. 5–7 are various pulse diagrams, shown in detail and on a larger scale.
Figure 6:
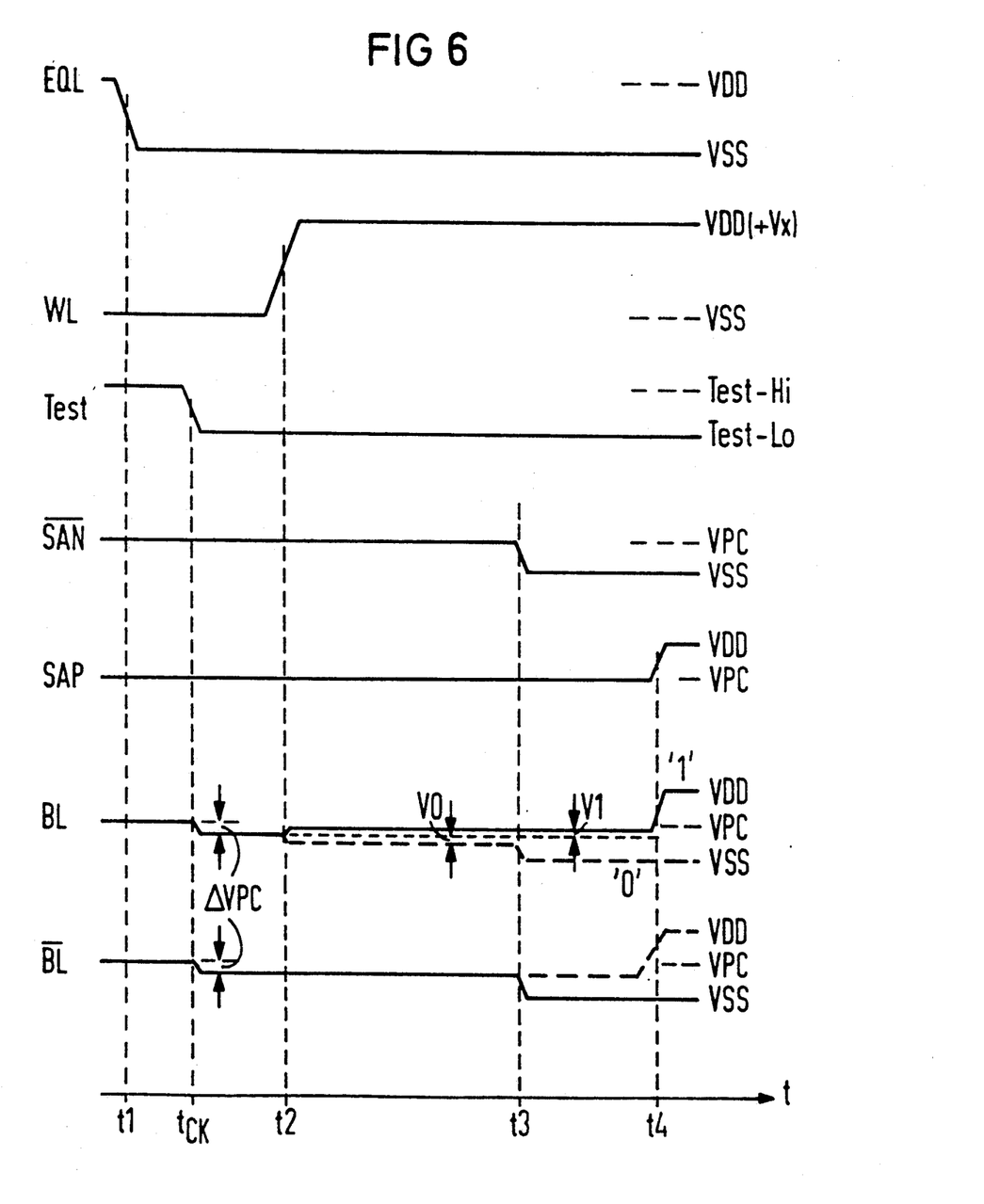
Figure 7:
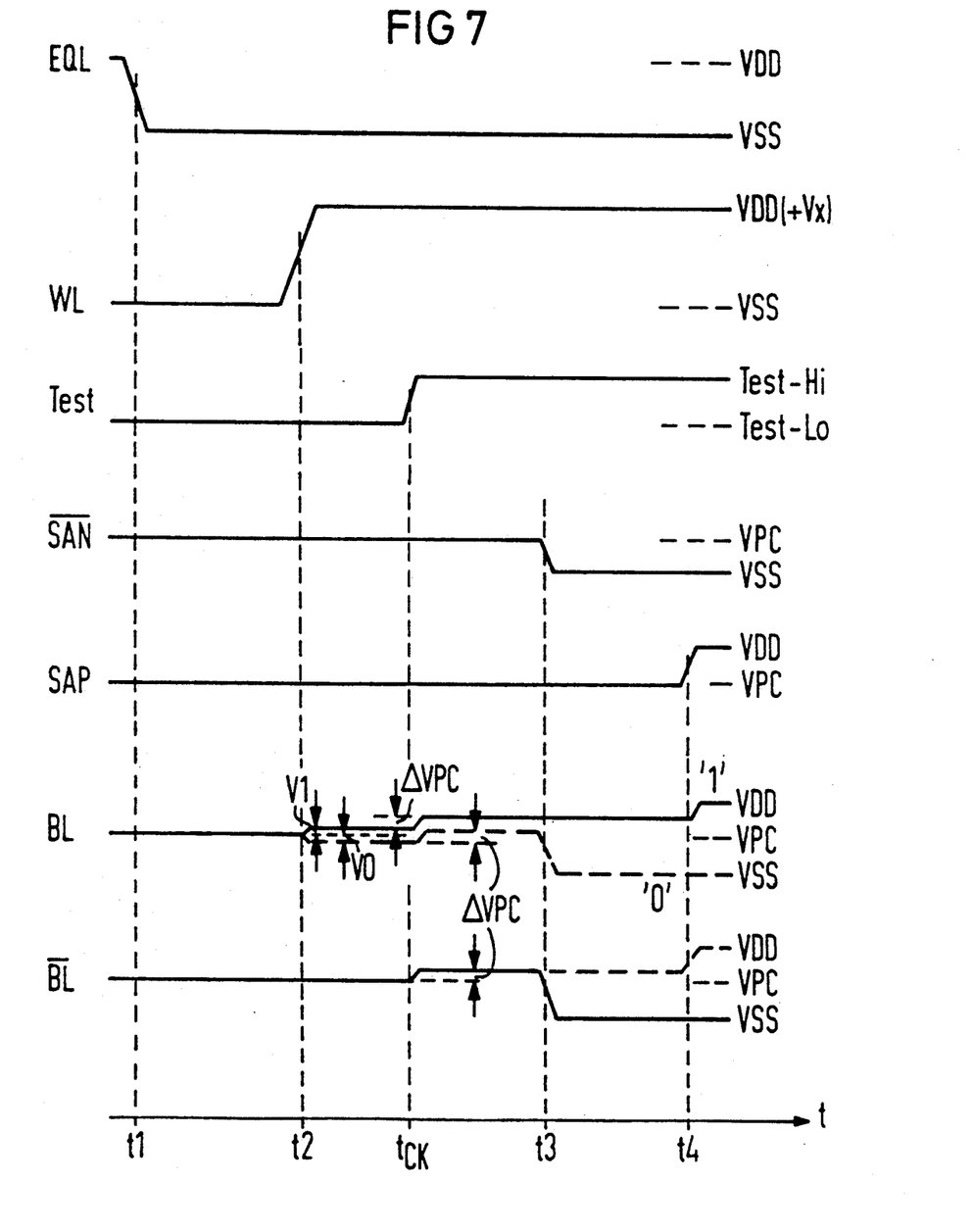

FIG. 4 shows the pulse diagram of FIG. 2, which is expanded by adding the test signal Test (two possible courses are indicated), and it also shows its effects on the bit line pair BL, $\overline{BL}$. The test signal Test effects the feeding of the additional potential $\Delta$VPC to the bit line pair BL, $\overline{BL}$, by means of an edge change at a time $t_{CK}$. The edge change takes place no earlier than the end of the precharging process (time t1) and no later than before the beginning of the evaluation and amplification process (time t3). In order to show the entire process more clearly, the periods of time between the instants shortly before t1 and shortly after t4 in FIGS. 5–7 are shown as disproportionately being long. FIGS. 5 and 7 show a positive edge change of the test signal Test and FIG. 6 shows a negative edge change. The time $t_{CK}$ of the edge change in FIGS. 5 and 6 is also located between the times t1 and t2 whereas in FIG. 7, it is located between the times t2 and t3. First, FIG. 4 will be described in further detail, in conjunction with FIG. 5.

Up to the time t1, there is no difference between the pulse diagrams of FIGS. 2 and 4, except for the test signals Test. The test signal is at a first level. According to FIGS. 4 and 5, this is assumed to be a low level Test-Lo (represented by a solid line). At the time $t_{CK}$, the above-mentioned edge change takes place. The test signal Test assumes a second level, which in the case of FIG. 5 is a high level Test-Hi. As a result, an additional potential $\Delta$VPC is fed to the bit line BL and to the reference bit line $\overline{BL}$ through the coupling capacitors CK, causing the bit line BL and the reference bit line $\overline{BL}$ to assume a potential that is increased by the additional potential $\Delta$VPC. Upon the ensuing activation of the word line WL, the corresponding amount V1 (or V0), which represents the read signal, acts upon the total potential of the bit line BL, which has been increased by the additional potential $\Delta$VPC, and increases it correspondingly further by the amount V1 (or reduces it by the amount V0). The read signal does not affect the reference bit line $\overline{BL}$, analogously to what is shown in FIG. 2, and as a result the reference bit line $\overline{BL}$ maintains its potential that has been increased by the additional potential $\Delta$VPC. Then, as already explained with reference to FIG. 2, the clock signals $\overline{SAN}$ and SAP are activated at the respective times t3 and t4, which causes the evaluation and amplification process by means of the evaluator circuit AMP. The test signal Test resumes its original state no later than the time t6 (and for instance at the time t5).

As described above, in the pulse diagram of FIG. 5, the test signal Test has a positive edge change (is "positive-going") at the time $t_{CK}$. In contrast, in the pulse diagram of FIG. 6, the test signal Test at the time $t_{CK}$ has a negative edge change (is "negative-going"). Consequently, the precharge potential VPC of the bit line BL is reduced by the amount $\Delta$VPC. The remaining course is similar to the course of FIG. 5 that was already described.

Although the pulse diagram of FIG. 7 again shows a positive edge change (similar to FIG. 5), the time $t_{CK}$ of the edge change is located between the times t2 and t3. As a consequence, at the time $t_{CK}$ of the feeding of the additional potential $\Delta$VPC to the bit line pair BL, $\overline{BL}$, the bit line BL already has a potential that has been raised or lowered by the read signal V1 or V0, as compared with the precharge potential VPC. However, as compared with the pulse diagram of FIG. 5 this has no dissimilar influence on the evaluation and amplification, or in other words on the processes from the time t3 on, because at the time t3 both the bit line BL and the reference line $\overline{BL}$ in both FIGS. 5 and 7 (on the condition of identical read signals V1 and V0 and identical precharge potentials VPC) have the same total potential VPC +V1 (or −V0) +ΔVPC (for bit line BL) or VPC +ΔVPC (reference bit line $\overline{BL}$).

According to a further feature of the invention, it is advantageous for the high level Test-Hi of the test signal Test to be a variably preselectable value. It is also advantageous for the low level Test-Lo of the test signal Test to be a variably preselectable value. The advantage obtained is that the additional potential ΔVPC is variable in terms of amount, due to the variable preselectable value of the high level Test-Hi and/or the low level Test-Lo.

Another advantage is that the edge determining the feeding of the test signals Test can be either a positive or a negative edge, because the potentials of the bit line BL and the reference bit line $\overline{BL}$ can be either increased or decreased as a result.

It is also advantageous for the control line CTRL to be wired in an electrically floating manner during normal operation, for example. In other words it is advantageous for it not to be connected to the test signal Test, or for it to be associated with a fixed potential during normal operation. This assures operation of the semiconductor memory independently of the test signal Test. That is, no feeding of the additional potential ΔVPC takes place. The coupling of the test signal Test to the control line CTRL, or the uncoupling thereof, can be accomplished, for instance, by the known pulse sequence or train "$\overline{CAS}$-before-$\overline{RAS}$" (on this point, see the literature already referred to above, namely IEEE Journal of Solid-State Circuits, Vol. SC-22, particularly Section III). By now, "$\overline{CAS}$-before-e,ovs/$\overline{RAS}$/" operation has become a standard aid to one skilled in the art, for performing any type of test in an integrated semiconductor memory.

Figure 8:
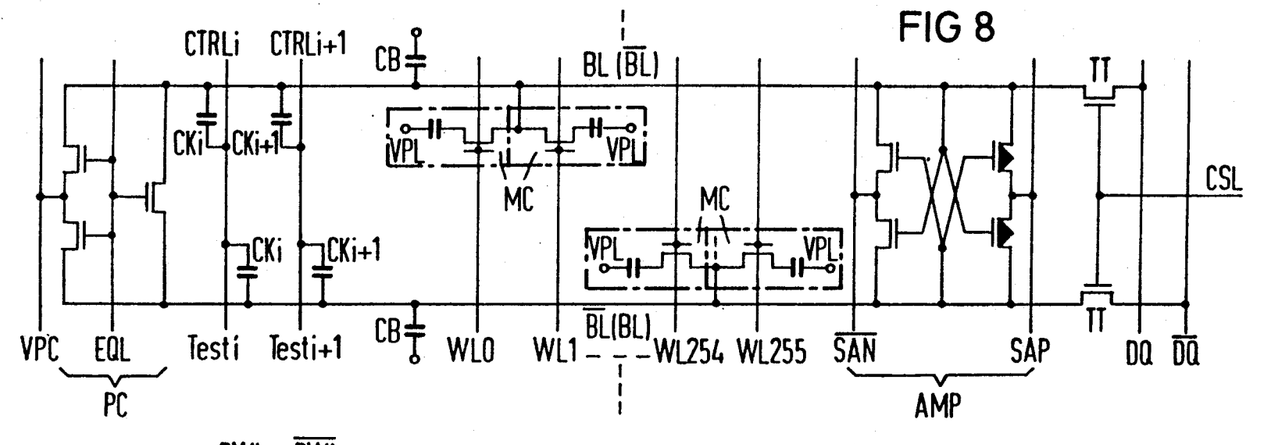

As shown in the drawing of FIG. 8, instead of or in addition to the coupling capacitors CK together with the associated control line CTRL per bit line pair BL, $\overline{BL}$, it is also advantageous to provide a plurality of coupling capacitors CKi per bit line BL and reference bit line $\overline{BL}$, with control lines CTRLi that can be connected independently of one another during operation with test signals Testi. The test signals Testi have defined, predetermined high and low levels Test-Hi and Test-Lo. However, according to a variant of the invention, variably preselectable levels can be provided. The selection of the high and low levels of the test signals Testi is carried out for the sake of simplicity through the aforementioned "$\overline{CAS}$-before-e,ovs/$\overline{RAS}$/" operation with the aid of a simple selection circuit, by pickup of a resistor chain, or the like. Advantageously, the test signals Test1i can also be imposed individually.

Both the use of a plurality of coupling capacitors CKi, instead of or in addition to a single coupling capacitor CK per bit line BL and reference bit line $\overline{BL}$, and the variable selectability of high and/or low levels Test-Hi, Test-Lo of the test signal Test or test signals Testi make it possible to vary the values of the additional potential ΔVPC. The value of the additional potential ΔVPC can be determined in accordance with the following formula:

$$\Delta VPC = (\text{Test-Hi} - \text{Test-Lo}) \cdot \frac{CK}{CK + CB},$$

where CB is the value of the capacitor of a bit line BL or reference bit line $\overline{BL}$, and the remaining operands represent the value of the elements described under the same reference symbols.

If, for instance, the first supply potential VDD =5 V, the second supply potential VSS =0 V and the amount of a typical read signal =50 mV, then it is favorable in various test cycles to define the values of the additional potential ΔVPC, for example, from 50 mV to 500 mV in stages of 50 mV each.

The present invention has the following important advantages:

the capability of analyzing sensitivity, speed and symmetry behavior (in terms of distinguishability of logical 0 from logical 1 in the read signal) of the evaluator and amplifier circuits AMP and memory cells MC, by varying the precharge potentials VPC by means of the additional potential ΔVPC;

the capability of analyzing the magnitude and variation of the read signals V1, V0 and the values of the memory capacitors of the memory cells MC as a function of the additional potential ΔVPC by the following formula:

$$\Delta V1, \Delta V0 = \Delta VPC \cdot \frac{C_{MC}}{C_{MC} + CB},$$

where ΔV1 and ΔV0 are equivalent to the incident variation of the read signal as a function of the variation of the additional potential ΔVPC in the readout of information corresponding to a logical 1 or a logical 0, and $C_{MC}$ represents the size of the storage capacity of the read-out memory cell MC.

These analyses capabilities are either entirely nonexistent in the prior art, or are attainable only at high cost for equipment.

The present invention has been described in terms of an integrated semiconductor memory that does not have so-called dummy cells. However, it can also be used for integrated semiconductor memories that do have such dummy cells. In principle, two different possibilities for constructing dummy cells are known:

a) a dummy cell DC constructed as a one-transistor memory cell, that is, with a selection transistor and memory capacitor (usually half the size of the memory capacity of a "normal" memory cell MC); and b) a dummy cell in the form of the "complementary capacitor-coupled dummy cell" (see the literature already referred to, namely IEEE Journal of Solid-State Circuits, Vol. SC-20, particularly FIGS. 2 and 3).

Figure 9:
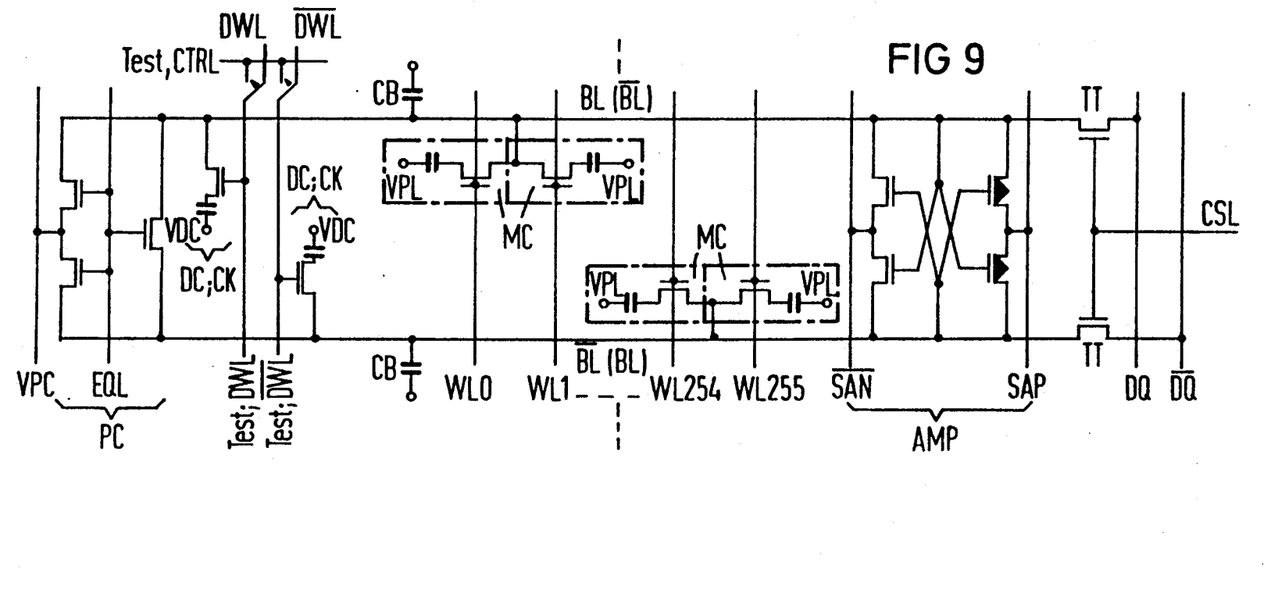

FIG. 9 shows an advantageous special application of the present invention to case a) above. The dummy cells are represented by the symbol DC. One end of the capacitors of the dummy cells DC are at a fixed potential. In the test situation, instead of the selection transistor of a single dummy cell DC of the bit line pair BL, $\overline{BL}$ being triggered by means of a line acting as a dummy word line DWL (or $\overline{DWL}$), as is usual in the normal situation, the selection transistors of all of the dummy cells DC of a bit line pair BL, $\overline{BL}$ are triggered by lines acting as common control lines CTRL. Thus both of the selection transistors become partly conducting as a function of the value of the test signal Test, resulting in the formation of an additional potential ΔVPC on the bit line BL and the reference bit line $\overline{BL}$ that is determined quantitatively by the test signal Test. However, with this version, only a lowering of the potential of the bit line pair BL, $\overline{BL}$ by the additional potential ΔVPC can be attained.

However, the additional potential ΔVPC is also attainable if the test signal Test has levels that are equal to logical levels (logical 0, logical 1), although in that case it is favorable to be able to variably adjust the additional potential ΔVPC, if the capacitors of the dummy cells DC are connected at one end to a variable, adjustable potential VDC.

Figure 10:
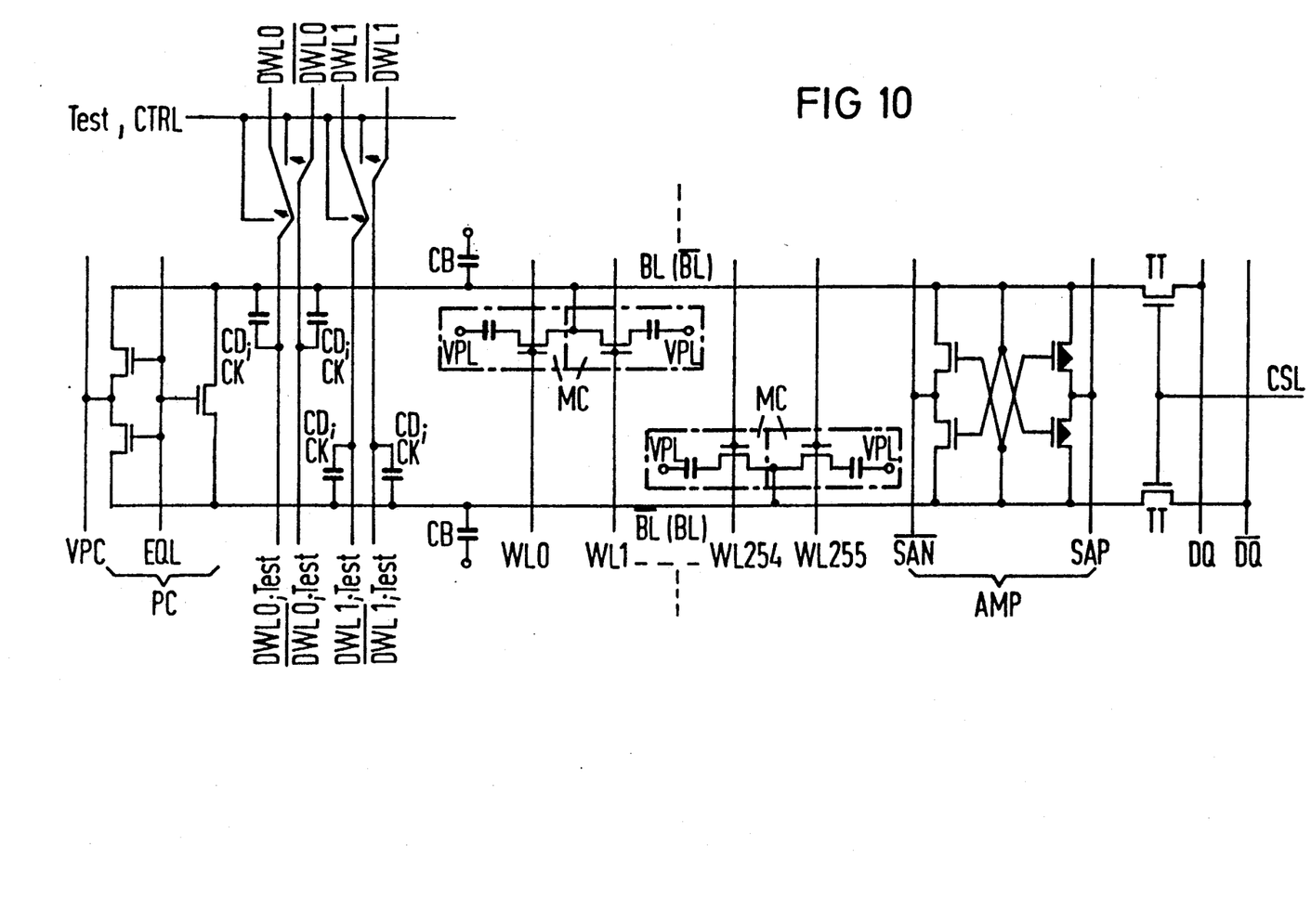

The application of the invention to case b) above is similar (see FIG. 10). Each coupling capacitor CK of FIG. 3 is equivalent in FIG. 10 to two compensation cells CD (which are connected in parallel in the test case). The parallel connection is attained by performing a common triggering in the test case, by means of the test signal Test, instead of a triggering by means of the dummy word lines $\overline{DWL0}$, (for the bit line BL) and by means of the dummy word lines $\overline{DWL1}$, (for the reference bit line $\overline{BL}$).

It is advantageous in cases a) and b) for the existing dummy cells DC to be able to take over the function of the coupling capacitors CK while performing their function as dummy cells, in the test case, by being connected to the test signal Test. In the test case the integrated semiconductor memory accordingly has no dummy cells DC. Instead, it has coupling capacitors in the sense of the present invention. This dual function requires a minimum surface area requirement for the present invention.

We claim:

1. Integrated semiconductor memory of the DRAM type, comprising word lines, bit line pairs, memory cells in a matrix being connected to said word lines and said bit lines, a plurality of sense amplifiers, each sense amplifier being connected to a respective bit line pair, each of said bit line pairs being divided into one bit line and one reference bit line, a control line, at least one first coupling capacitor for each of said bit lines, and at least one second coupling capacitor for each of said reference bit lines, each of said coupling capacitors having a first lead connected to a respective line of said bit line pairs and a second lead connected to said control line, means for applying a fixed potential to said control line when operating said semiconductor memory in a normal operating mode, and means for applying via said first and second coupling capacitor a test signal to said bit line pairs when operating said semiconductor memory in a test operating mode.

2. Integrated semiconductor memory according to claim 1, wherein said test signal has a preselectable high level.

3. Integrated semiconductor memory according to claim 2, including at least one other control line, and means for applying a fixed potential to at least one of said control lines for testing said semiconductor memory.

4. Integrated semiconductor memory according to claim 2, including at least one other control line, and means for applying an electrical potential to at least one of said control lines for testing said semiconductor memory.

5. Integrated semiconductor memory according to claim 1, wherein said test signal has a preselectable low level.

6. Integrated semiconductor memory according to claim 5, including at least one other control line, and means for applying a fixed potential to at least one of said control lines for testing said semiconductor memory.

7. Integrated semiconductor memory according to claim 5, including at least one other control line, and means for applying an electrical potential to at least one of said control lines for testing said semiconductor memory.

8. Integrated semiconductor memory according to claim 1, wherein said at least one first and second coupling capacitors for each of said bit line pairs include more than one first coupling capacitor for each of said bit lines and more than one second coupling capacitor for each of said reference bit lines, and including other control lines, each of said coupling capacitors being connected to one of said control lines, said control lines carrying test signals being activatable independently of one another when the semiconductor memory is operated in said test operating mode.

9. Integrated semiconductor memory according to claim 1, including dummy cells being used as coupling capacitors when operating the semiconductor memory in said test operating mode, dummy word lines connected to said dummy cells and means for applying said test signal to said dummy word lines for disabling said dummy cells.

10. Integrated semiconductor memory of the DRAM type, comprising word lines, bit line pairs, memory cells in a matrix being connected to said word lines and said bit lines, a plurality of sense amplifiers, each of said sense amplifiers being connected to a respective bit line pair, each of said bit line pairs being divided into one bit line and one reference bit line, a control line, at least one first coupling capacitor for each of said bit lines and at least one second coupling capacitor for each of said reference bit lines, each of said coupling capacitors having first leads connected to a respective line of said bit line pair and second leads connected commonly to said control line, means for applying an electrical potential to said control line when operating said semiconductor memory in a normal operating mode, and means for applying a test signal to said control line when operating said semiconductor memory in a test mode.

11. Integrated semiconductor memory according to claim 10, wherein said test signal has a preselectable high level.

12. Integrated semiconductor memory according to claim 11, including at least one other control line, and means for applying a fixed potential to at least one of said control lines for testing said semiconductor memory.

13. Integrated semiconductor memory according to claim 11, including at least one other control line, and means for applying an electrical potential to at least one of said control lines for testing said semiconductor memory.

14. Integrated semiconductor memory according to claim 10, wherein said test signal has a preselectable low level.

15. Integrated semiconductor memory according to claim 14, including at least one other control line, and means for applying a fixed potential to at least one of said control lines for testing said semiconductor memory.

16. Integrated semiconductor memory according to claim 14, including at least one other control line, and means for applying an electrical potential to at least one of said control lines for testing said semiconductor memory.

17. Integrated semiconductor memory according to claim 10, wherein said at least one first and second coupling capacitors for each of said bit line pairs include more than one first coupling capacitor for each of said bit lines and more than one second coupling capacitor for each of said reference bit lines, and including other control lines, each of said coupling capacitors being connected to one of said control lines, said control lines carrying test signals being activatable independently of one another when the semiconductor memory is operated in said test operating mode.

18. Integrated semiconductor memory according to claim 10, including dummy cells being used as coupling capacitors when operating the semiconductor memory in test operating mode, dummy word lines connected to said dummy cells and means for applying said test signal to said dummy word lines for disabling said dummy cells.

19. Method for testing an integrated semiconductor memory of the DRAM type, which comprises precharging bit line pairs to a precharge potential, said precharge potential having a value being an optimum value with respect to operating conditions of said sense amplifier, coupling an additional potential to each bit line pair after precharging, reading out data stored in memory cells and sensing and amplifying said data after reading out.

20. Method according to claim 19, which comprises coupling the additional potential through coupling capacitors.

21. Method according to claim 20, which comprises controlling the coupling with at least one test signal.

22. Method according to claim 20, which comprises controlling said coupling of the additional potential by means of a changing edge of at least one test signal.

23. Method according to claim 20, which comprises controlling said coupling of the additional potential by means of a positive going edge of at least one test signal.

24. Method according to claim 20, which comprises controlling said coupling of the additional potential by means of a negative going edge of at least one test signal.

25. Method according to claim 19, which comprises controlling the coupling with at least one test signal.

26. Method according to claim 19, which comprises coupling the additional potential by means of a changing edge of at least one test signal.

27. Method according to claim 19, which comprises controlling said coupling of the additional potential by means of a positive going edge of at least one test signal.

28. Method according to claim 19, which comprises controlling said coupling of the additional potential by means of a negative going edge of at least one test signal.

* * * * *